(12) United States Patent
Spears et al.

(10) Patent No.: US 7,208,719 B2
(45) Date of Patent: Apr. 24, 2007

(54) COMPACT INTEGRATED OPTICAL IMAGING ASSEMBLY

(75) Inventors: Kurt E. Spears, Fort Collins, CO (US); Rodney C. Harris, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 338 days.

(21) Appl. No.: 10/437,569

(22) Filed: May 14, 2003

(65) Prior Publication Data

US 2004/0227058 A1    Nov. 18, 2004

(51) Int. Cl.
*H01J 3/14* (2006.01)

(52) U.S. Cl. .................. 250/216; 250/239; 359/833

(58) Field of Classification Search ............. 250/208.1, 250/216, 239, 234; 358/400, 474, 482–484, 358/500, 513, 514; 359/831, 833
See application file for complete search history.

(56) References Cited

U.S. PATENT DOCUMENTS

| 5,985,690 | A | 11/1999 | Fujikura | 438/68 |
| 6,108,461 | A | 8/2000 | Haga | 382/312 |
| 6,160,250 | A | * 12/2000 | Miksch et al. | 250/208.1 |
| 6,178,012 | B1 | 1/2001 | Larkin et al. | 358/474 |
| 6,266,089 | B1 | 7/2001 | Shimamura | 348/301 |
| 6,294,776 | B2 | 9/2001 | Miksch et al. | 250/208.1 |
| 6,343,162 | B1 | 1/2002 | Saito et al. | 382/312 |
| 6,346,699 | B1 | 2/2002 | Bohn et al. | 250/214 R |
| 6,350,980 | B1 | 2/2002 | Bohn | 250/208.1 |
| 6,389,183 | B1 | 5/2002 | Han | 382/313 |
| 6,426,498 | B1 | 7/2002 | Bohn et al. | 250/234 |
| 6,775,077 | B1 | * 8/2004 | Feng | 359/831 |
| 2003/0184825 | A1 | * 10/2003 | Hayashi | 358/509 |
| 2004/0178373 | A1 | * 9/2004 | Graber et al. | 250/559.36 |

OTHER PUBLICATIONS

PI240MC-A4 200DPI CIS Module Engineering Data Sheet. Peripheral Imaging Corporation, Apr. 5, 2001, 6 pages.

* cited by examiner

*Primary Examiner*—Thanh X. Luu
*Assistant Examiner*—Stephen Yam

(57) ABSTRACT

An assembly for an image capture device comprises an imaging lens, an optical spacer comprising at least one reflective surface and physically integrated with the imaging lens, and a photo-sensing system physically integrated with the optical spacer.

6 Claims, 2 Drawing Sheets

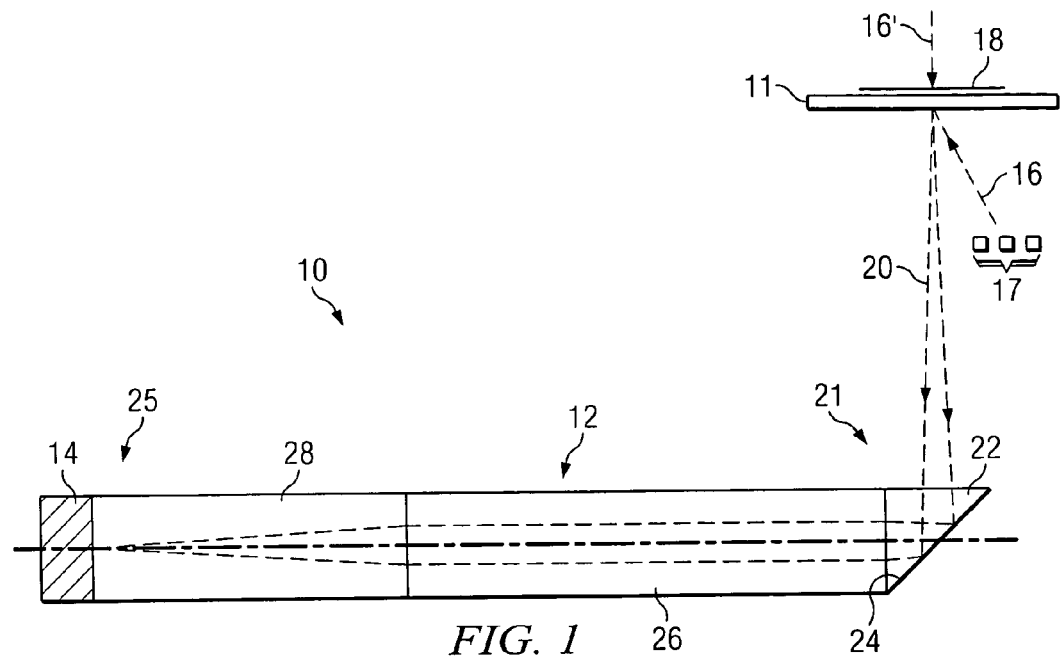
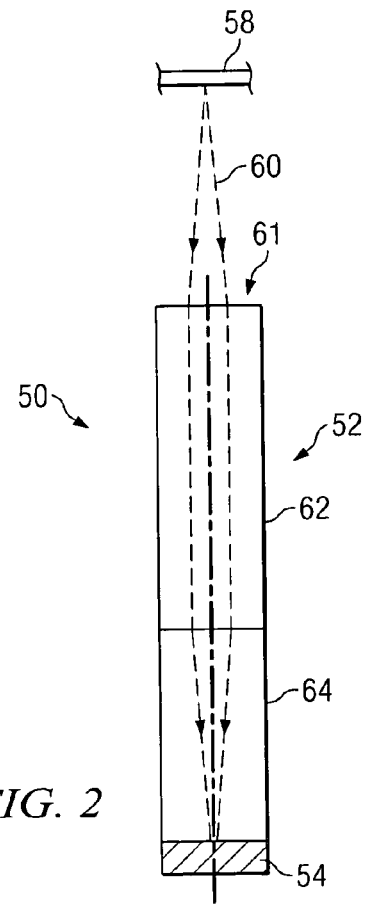
FIG. 1
FIG. 2

COMPACT INTEGRATED OPTICAL IMAGING ASSEMBLY

TECHNICAL FIELD OF THE INVENTION

The present invention relates generally to the field of imaging devices, and more particularly to a compact integrated optical imaging assembly.

BACKGROUND OF THE INVENTION

Optical imaging devices such as scanners, copiers, facsimile machines, multifunction devices are capable of "reading" paper documents, photographs, transparencies, and other objects to generate an image thereof. The generated scan image can be displayed on a computer screen, printed, and/or transmitted via electronic means to remote locations.

A typical imaging device may include an optical imaging assembly comprising an illumination source, an optical system, and a photo-sensing system. The illumination source projects light onto a portion of the object being scanned, and the optical system collects the light reflected by the illuminated object. The photo-sensing system then detects the reflected light and generates electric signals in response to the detected light. The assembly of the various components of the imaging device often requires precise positioning, orientation and alignment to ensure the light from the illumination source properly illuminates the target scan region on the object and the reflected light is properly focused onto the optical sensing system. The position and orientation of the various components in the assembly must remain fixed to maintain a crisp scanned image.

SUMMARY OF THE INVENTION

In accordance with an embodiment of the present invention, an assembly for an image capture device comprises an imaging lens, an optical spacer comprising at least one reflective surface and physically integrated with the imaging lens, and a photo-sensing system physically integrated with the optical spacer.

In accordance with another embodiment of the invention, an image capture assembly comprises an imaging lens, an optically-transparent spacer physically abutting and integrally coupled to the imaging lens, the spacer comprising at least two reflective surfaces. The assembly further comprises a photo-sensing system physically abutting and integrally coupled to the optically-transparent spacer. An image light entering the imaging lens and spacer is directed by the at least two reflective surfaces toward the photo-sensing system.

BRIEF DESCRIPTION OF THE DRAWINGS

For a more complete understanding of the present invention, the objects and advantages thereof, reference is now made to the following descriptions taken in connection with the accompanying drawings in which:

FIG. 1 is a cross-sectional schematic side view of a horizontal embodiment of the compact integrated imaging assembly according to the present invention;

FIG. 2 is a cross-sectional schematic side view of a vertical embodiment of a compact integrated imaging assembly;

DESCRIPTION OF THE DRAWINGS

Figure 3:
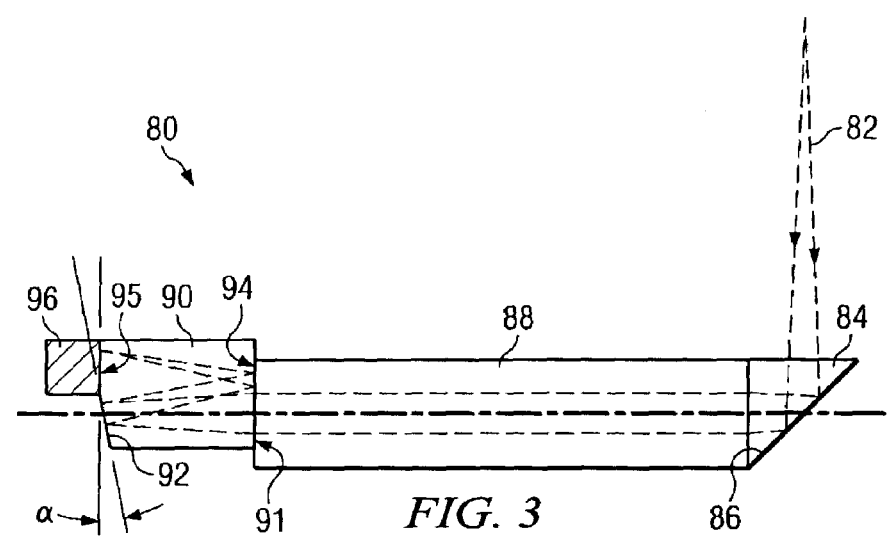
FIG. 3 is a cross-sectional schematic side view of another horizontal embodiment of a compact integrated imaging assembly.

The preferred embodiment of the present invention and its advantages are best understood by referring to FIGS. 1 through 5 of the drawings, like numerals being used for like and corresponding parts of the various drawings.

FIG. 1 is a cross-sectional schematic side view of a horizontal embodiment of the compact integrated imaging assembly 10 according to the present invention. Compact integrated imaging assembly 10 may be employed in a myriad of image capture devices such as copiers, scanners, facsimile machines, multifunction devices, and the like. Compact integrated imaging assembly 10 comprises an integrated optical system 12 and a photo-sensing system 14 integrated with one another. Imaging assembly 10 is contained within a compact housing topped with a platen 11. Incident light 16 from an illumination source 17, such as an array of light-emitting diodes (LEDs) or any other suitable light-emitting devices now known or later developed, strikes a scan region of an object 18. Object 18 may be a paper document, photograph, transparency, film or another object disposed on the other side of platen 11 or imaging window of imaging assembly 10. Incident light 16 strikes object 18 and is reflected as an image light 20 to integrated optical system 12 of the imaging assembly. Alternatively, incident light 16' may strike object 18 from an opposing side and pass through object 18 as image light 20 to integrated optical system 12. Prior to reaching photo-sensing system 14, image light 20 is guided and focused by integrated optical system 12. Integrated optical system 12 may comprise any of a wide variety of optical components such as lenses and/or reflectors.

Image light 20 enters imaging assembly 10 via a first optical component 22 operable to redirect the path of image light 20 and disposed at a first end 21 of integrated optical system 12. First optical component 22 comprises an angled reflective surface 24. Image light 20 strikes angled reflective surface 24 and is reflected toward photo-sensing system 14 disposed at a second end 25 of imaging assembly 10. Reflective surface 24 may be a metallic or mirrored surface formed on the selected angle surface of integrated optical system 12. The angle of incline for reflective surface 24 is selected so that image light 20 reflecting off object 18 is further reflected and targeted at the photodetectors in photo-sensing system 14. First optical component 22 of integrated optical system 12 may be attached or mounted to the rest of the optical system by an optically-clear or transparent adhesive. An adhesive manufactured by Norland Products Inc. of Cranbury, N.J., such as the NOA 61, may be used. Other means to integrate first optical component 22 to optical system 12 may also be used. For example, first optical component 22 may be clamped or affixed to optical system 12 via mechanical means. Alternatively, transparent portion 22 may be formed integrally with integrated optical system 12 by injection molding or other suitable methods.

In a preferred embodiment, integrated optical system 12 comprises an imaging lens 26 such as a micro-lens array or gradient index (GRIN) lens. Imaging lens 26 may comprise one or an array of cylindrical elements made from glass, plastic or another suitable material. In a preferred embodiment, a GRIN lens such as the type sold under the name SELFOC (registered trademark of Nippon Sheet Glass Company, Limited) may be employed herein. Coupled between imaging lens 26 and photo-sensing system 14 is a second optical component 28. Second optical component 28 is an optical spacer that is preferably constructed of a solid piece of a generally transparent material such as glass, optical quality plastic or another suitable material. Image light 20 exiting from imaging lens 26 enters optical spacer 28 where it continues to be focused and targeted onto the sensors (not explicitly shown) in photo-sensing system 14. In a preferred embodiment, photo-sensing system 14 comprises an array of photodetectors, an integrated photodetector such as a charge-coupled device (CCD), complementary metal oxide semiconductor (CMOS) image sensor, or another suitable sensor now known or later developed. A generally transparent adhesive may be used to integrate and adhere imaging lens 26, optical spacer 28 and photo-sensing system 14 together. Alternatively, mechanical means may be used to achieve the same. Therefore, first optical component 22, imaging lens 26, optical spacer 28, and photo-sensing system 14 physically abut one another and form a single unitary piece of construction.

When image light 20 reaches the sensor array in photo-sensing system 14, varying electrical currents are generated in response to the intensity of image light 20. The varying electrical currents are converted to digital signals and interpreted as light and dark areas on the object being scanned. The signals generated by photo-sensing system 14 may be transmitted to a microprocessor or controller in the imaging device, where the signals are processed and otherwise operated on.

FIG. 2 is a cross-sectional schematic side view of a vertical embodiment 50 of the compact integrated imaging assembly according to the present invention. Vertical imaging assembly 50 is generally oriented along the same axis as the image light reflected from the object being scanned. Imaging assembly 50 comprises an optical system 52 and a photo-sensing system 54 integrated with one another. An incident light from an illumination source (not shown), such as an array of light-emitting diodes (LEDs) and any other suitable light-emitting devices now known or later developed, strikes a scan region of an object 58. The incident light strikes object 58 and is projected as an image light 60 toward a generally transparent end 61 of optical system 52 of the imaging assembly. Because vertical imaging assembly 50 is oriented along the same axis as image light 60 coming from object 58, there is no need to use other optical components to alter the path of image light 60.

Image light 60 enters optical system 52, which may comprise any of a wide variety of optical components such as lenses and/or reflectors that direct, focus, or otherwise act on the light. In a preferred embodiment, optical system 52 comprises an imaging lens 62 such as a micro-lens array or GRIN lens. Imaging lens 62 may comprise an array of cylindrical elements made from glass, optical-grade plastic or another suitable material. Integrally coupled between imaging lens 62 and photo-sensing system 54 is an optical spacer 64. Optical spacer 64 is preferably constructed of a solid piece of a generally transparent material such as glass, optical-grade plastic or another suitable material. Image light 60 exiting from imaging lens 62 enters optical spacer 64 where it continues to be focused and targeted onto the sensors in photo-sensing system 54. In a preferred embodiment, photo-sensing system 54 comprises a contact image sensor, an array of photodetectors, an integrated photodetector such as a charge-coupled device, or another suitable sensor now known or later developed. When image light 60 reaches the sensor array in photo-sensing system 54, it generates varying electrical currents that are indicative of light and dark areas on the object being scanned. The signals generated by photo-sensing system 54 may be transmitted to a microprocessor or controller in the imaging device where the signals are processed and otherwise operated on.

An adhesive, mechanical device or other suitable means may be used to integrally couple imaging lens 62, optical spacer 64, and photo-sensing system 54 into a single unitary piece of construction so that precise alignment of the components can be achieved. Further, the direct coupling of the components of imaging assembly 50 makes its dimensions very compact.

Depending on the desired application of the image capture device, such as a flat-bed scanner or a portable scanner, for example, either the horizontal or vertical orientation of the compact integrated imaging assembly may be used to its advantage. The compactness of the imaging assembly lends itself easily to portable or handheld image capture device applications. Further, the integrated construction largely eliminates the time and cost of precisely positioning the components and yet still achieves accurate alignment.

FIG. 3 is a cross-sectional schematic side view of another horizontal embodiment 80 of the compact integrated imaging assembly according to the present invention. Imaging assembly 80 employs various optical components to make its footprint even more compact than imaging assembly 10 shown in FIG. 1. An incident light from an illumination source (not shown), such as an array of light-emitting diodes and any other suitable light-emitting devices now known or later developed, strikes a scan region of an object (not shown). The light from the illumination source strikes the object and proceeds as an image light 82 to imaging assembly 80. Image light 82 enters imaging assembly 80 via a transparent first optical component 84. The image light continues in the same path and strikes an angled reflective surface 86 of imaging assembly 80 and is reflected along a major axis in alignment with the longitudinal axis of imaging assembly 80 and toward an imaging lens 88 such as a micro-lens array or GRIN lens. Reflective surface 86 may be a metallic or mirrored surface formed on the selected angle surface of the optical system. Transparent portion 84 of the optical assembly may be attached or mounted to the optical system by an optically clear or transparent adhesive. Alternatively, transparent portion 84 may be formed integrally with the lens portion 88 of the optical system by injection molding or other suitable methods. Mechanical means of affixing the components may also be used.

Image light 82 is guided and focused by the optical system and then directed to an optical spacer 90 integrally coupled to imaging lens 88. Optical spacer 90 is constructed of a solid piece of a generally transparent material such as glass, optical quality plastic or another suitable material with some selected surfaces made reflective. Image light 82 exiting from imaging lens 88 enters optical spacer 90 where it continues to be focused and directed toward the sensors (not explicitly shown) in photo-sensing system 96. In this embodiment of the invention, optical spacer 90 comprises a transparent window 91 operable to receive light from imaging lens 88, and reflective surfaces 92 and 94 to direct the image light to photo-sensing system 96 via a second transparent window 95. Reflective surface 92 occupies a portion of the interface between imaging lens 88 and optical spacer 90 and is positioned at a non-perpendicular angle, $\alpha$, with respect to the major axis of the image light path. As a result, optical spacer 90 comprises a complex shape and one or more reflective surfaces. The image light, entering via transparent window 91 and reflecting off reflective surfaces 92 and 94, is directed to photodetectors in photo-sensing system 96. It is also contemplated that the surfaces of optical spacer 90 be treated by materials or processes that make light passable in one direction only. Therefore, once light enters optical spacer 90, it is reflected until reaching photo-sensing system 96 via window 95.

In a preferred embodiment, photo-sensing system 96 comprises an array of photodetectors, an integrated photo-detector such as a charge-coupled device (CCD), CMOS image sensor, or another suitable sensor now known or later developed. Photo-sensing system 96 is coupled or mounted to the optical system by using a generally transparent adhesive at the interface between optical spacer 96 and photo-sensing system 96.

Figure 4:
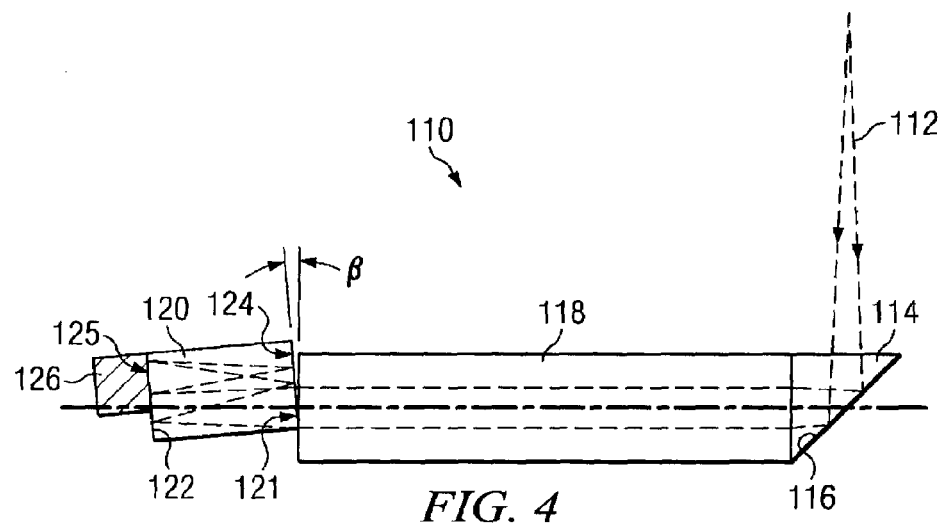
FIG. 4 is a cross-sectional schematic side view of yet another horizontal embodiment of a compact integrated imaging assembly.

FIG. 4 is a cross-sectional schematic side view of yet another horizontal embodiment 110 of the compact integrated imaging assembly according to the present invention. Instead of a complex optical spacer configuration of imaging assembly 80 described above and shown in FIG. 3, imaging assembly 110 employs a simple optical spacer configuration mounted at a predetermined angle to the major axis of the image light to focus and direct the image light to the photodetectors. An incident light from an illumination source (not shown) strikes a scan region of an object (not shown). The light from the illumination source strikes the object and proceeds as an image light 112 to imaging assembly 110. Image light 112 enters assembly 110 via a transparent optical component 114 thereof. The light continues in the same path until it strikes an angled reflective surface 116 of optical component 114 and is reflected along a major axis in alignment with the longitudinal axis of imaging assembly 110 toward an image lens 118 such as a micro-lens array, GRIN lens 118 or another suitable optical device of the optical system. Reflective surface 116 may be a metalic or mirrored surface formed on the selected angle surface of the optical system. Transparent portion 114 of the optical assembly may be attached or mounted to the optical system by an optically clear or transparent adhesive. Alternatively, transparent portion 114 may be formed integrally with the lens portion 118 of the optical system by injection molding or other suitable methods. Mechanical means may be used to physically abutt and integrally couple the components together to form a single unitary piece of construction.

Image light 112 is guided and focused by the optical system and then directed to an optical spacer 120. Optical spacer 120 is constructed of a solid piece of a generally transparent material such as glass, optical quality plastic or another suitable material with selected surfaces made reflective. Image light 112 exiting from imaging lens 118 enters optical spacer 120 via a transparent window 121 where it continues to be focused and directed toward the sensors in photo-sensing system 126 via a second transparent window 125. In this embodiment of the invention, optical spacer 120 comprises two or more reflective surfaces to direct the image light to the photodetectors in photo-sensing system 126. Furthermore, though the cross-section of optical spacer 120 is rectangular in shape, it is mounted to lens 118 at a predetermined angle so that its parallel reflective surfaces 122 and 124 are both skewed at an angle relative to the image light path exiting lens 118. As shown, two sides of optical spacer 120 as well as reflective surfaces 122 and 124 thereon are disposed at an angle, β, from an axis perpendicular to the image light path's major axis. As a result, image light 112 passing through optical spacer 120 is reflected by one or more of its angled reflective surfaces to direct it to the photodetectors in a photo-sensing system 126 integrally coupled to optical spacer 120. Unlike optical spacer 90 described above and shown in FIG. 3, optical spacer 120 comprises a simple and regular shape, such as a rectangular prism, with 90° angles and parallel sides. A clear or optically transparent adhesive may be used to securely attach optical spacer 120 to lens 118, and to attach photo-sensing system 126 to optical spacer 120. Mechanical means may be used to physically abutt and fully integrate the components together.

Figure 5:
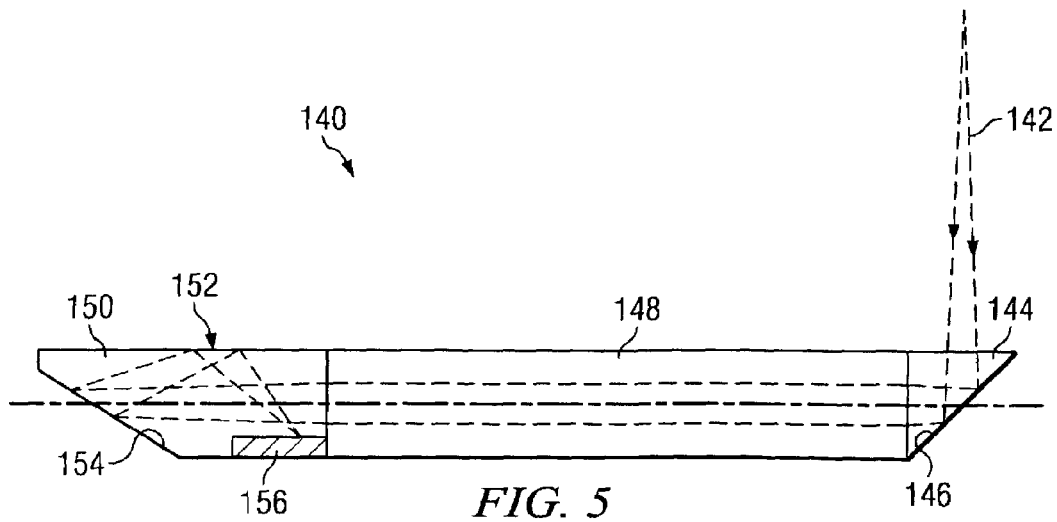
FIG. 5 is a cross-sectional schematic side view of another horizontal embodiment of a compact integrated imaging assembly.

FIG. 5 is a cross-sectional schematic side view of another horizontal embodiment 140 of the compact integrated imaging assembly according to the present invention. An incident light from an illumination source (not shown), such as an array of light-emitting diodes and any other suitable light-emitting devices now known or later developed, strikes a scan region of an object (not shown). The light from the illumination source strikes an object to be scanned and is projected as an image light 142 toward imaging assembly 140 and enters via a transparent optical component 144 thereof. The light continues in the same path and strikes an angled reflective surface 146 of the optical component and is reflected along a major axis in alignment with the longitudinal axis of imaging assembly 140 and toward an imaging lens 148 such as a micro-lens array or GRIN lens 148. Reflective surface 146 may be a metalic or mirrored surface formed on the selected angle surface of the optical system. Transparent optical component 144 may be attached or mounted to imaging lens 148 by an optically clear or transparent adhesive. Alternatively, optical component 144 may be formed integrally with the lens portion 148 of the optical system by injection molding or other suitable methods, or integrally coupled thereto by mechanical means.

Image light 142 is guided and focused by imaging lens and then directed to an optical spacer 150. Optical spacer 150 is integrally coupled to imaging lens 118 and constructed of a solid piece of a generally transparent material such as glass, optical-grade plastic or another suitable material. An optically-clear adhesive may be used to adhere optical spacer 150 to imaging lens 118 or by another suitable means. Image light 142 exiting from imaging lens 148 enters optical spacer 150 where it continues to be focused and directed toward the sensors (not explicitly shown) in photo-sensing system 156. In this embodiment of the invention, optical spacer 150 comprises at least one reflective and angled surfaces to direct the image light to photo-sensing system 156. As shown, image light 142 strikes a first reflective surface 154 disposed at an angle relative to the light path's major axis, and then strikes a second reflective surface 152 disposed substantially parallel with the image light path's major axis, prior to reaching photo-sensing system 156. Photo-sensing system 156, in this example, comprises photodetectors arranged in a plane substantially parallel with the light path's major axis rather than perpendicular therewith as in the previous embodiments. As a result, optical spacer 150 may comprise a complex shape and multiple reflective surfaces 152 and 154. The image light, reflecting off reflective surfaces 152 and 154, is directed to photodetectors in photo-sensing system 156. The photodetectors receive the image light and then generates the appropriate electrical signals in response to the light and dark information conveyed in the image light. Photo-sensing system 156 may be integrally coupled to optical spacer 150 with an optically-clear adhesive or constructed integrally therewith. Alternatively, mechanical means may be employed to tightly couple photo-sensing system 156 to optical spacer 150.

As compared with conventional constructions of the contact image sensor module that use discrete and separate components mounted on a printed circuit board or on a base, the various embodiments of the imaging assembly comprises integrated optical and electrical components that become a single compact unit. The smaller footprint enables the compact assembly to be used in applications that require portability. Further, by constructing a single integrated unit, the precise alignment of the components can be more easily achieved.

In the embodiments of the present invention, illumination for scanning may be generated by a thin LED light bar, fiber optic light guide or other technology now known or later developed. Alternatively, light from existing sources, such as in embodiments where the imaging assembly is located in a liquid crystal display or cathode ray tube monitor, the screen illumination may be used as the illumination source for scanning the object. Further, the method by which the optical and electrical components are integrated may be by using an adhesive, a manufacturing process that enable an integrated construction, or any other suitable process. It should be noted that FIGS. 1–5 are idealized schematic drawings and that the dimensions and angles depicted therein are merely illustrative. Further, for some reflecting surfaces in the optical assembly, total internal refraction may instead be employed.

What is claimed is:

1. An image capture assembly, comprising:
an imaging lens;
an optically-transparent spacer physically abutting and integrally coupled to the imaging lens, the spacer comprising at least two reflective surfaces;
a photo-sensing system physically abutting and integrally coupled to the optically-transparent spacer; and
whereby an image light entering the imaging lens and spacer is directed by the at least two reflective surfaces toward the photo-sensing system.

2. The assembly, as set forth in claim 1, wherein said imaging lens comprises a gradient index lens.

3. The assembly, as set forth in claim 1, wherein the imaging lens comprises a rod lens array.

4. The assembly, as set forth in claim 1, further comprising an optically transparent component having a reflective surface operable to receive the image light and direct the image light toward the imaging lens along a longitudinal axis of the assembly.

5. The assembly, as set forth in claim 1, wherein the optically-transparent spacer and the imaging lens are formed by injection molding.

6. The assembly, as set forth in claim 1, wherein the optically transparent spacer comprises at least two reflective surfaces that are parallel with one another.

* * * * *

UNITED STATES PATENT AND TRADEMARK OFFICE
CERTIFICATE OF CORRECTION

PATENT NO. : 7,208,719 B2
APPLICATION NO. : 10/437569
DATED : April 24, 2007
INVENTOR(S) : Kurt E. Spears et al.

It is certified that error appears in the above-identified patent and that said Letters Patent is hereby corrected as shown below:

In column 8, line 26, in Claim 6, delete "optically transparent" and insert -- optically-transparent --, therefor.

Signed and Sealed this

Nineteenth Day of May, 2009

JOHN DOLL
*Acting Director of the United States Patent and Trademark Office*